(12) United States Patent
Kubo et al.

(10) Patent No.: US 8,944,888 B2
(45) Date of Patent: Feb. 3, 2015

(54) CHEMICAL-MECHANICAL POLISHING PAD AND CHEMICAL-MECHANICAL POLISHING METHOD

(75) Inventors: Kotaro Kubo, Saitama (JP); Yukio Hosaka, Tsu (JP); Takahiro Okamoto, Yokkaichi (JP)

(73) Assignee: JSR Corporation, Tokyo (JP)

( * ) Notice: Subject to any disclaimer, the term of this patent is extended or adjusted under 35 U.S.C. 154(b) by 215 days.

(21) Appl. No.: 13/809,694

(22) PCT Filed: Jun. 13, 2011

(86) PCT No.: PCT/JP2011/063500
§ 371 (c)(1),
(2), (4) Date: Mar. 27, 2013

(87) PCT Pub. No.: WO2012/008252
PCT Pub. Date: Jan. 19, 2012

(65) Prior Publication Data
US 2013/0189907 A1    Jul. 25, 2013

(30) Foreign Application Priority Data

Jul. 12, 2010 (JP) ................................. 2010-157559
Jul. 12, 2010 (JP) ................................. 2010-157560
Aug. 5, 2010 (JP) ................................. 2010-175900

(51) Int. Cl.
*B24B 1/00* (2006.01)
*B24B 37/26* (2012.01)
(Continued)

(52) U.S. Cl.
CPC ................. *B24B 37/26* (2013.01); *B24B 37/24* (2013.01); *H01L 21/31053* (2013.01); *H01L 21/3212* (2013.01)
USPC .............................. 451/41; 451/537; 451/539

(58) Field of Classification Search
CPC ...... B24B 37/20; B24B 37/205; B24B 37/24; B24B 37/245; B24B 37/26; H01L 21/21053; H01L 21/5212
USPC ............................ 451/41, 526, 527, 533, 539
See application file for complete search history.

(56) References Cited

U.S. PATENT DOCUMENTS 5,921,855 A    7/1999 Osterheld et al.
5,984,769 A    11/1999 Bennett et al.
(Continued)

FOREIGN PATENT DOCUMENTS

JP    5 146969    6/1993
JP    11 70463    3/1999
(Continued)

OTHER PUBLICATIONS

International Search Report Issued Aug. 23, 2011 in PCT/JP11/63500 Filed Jun. 13, 2011.
(Continued)

*Primary Examiner* — Maurina Rachuba
(74) *Attorney, Agent, or Firm* — Oblon, Spivak, McClelland, Maier & Neustadt, L.L.P.

(57) ABSTRACT

A chemical mechanical polishing pad includes a polishing layer, a recess being formed in a polishing surface of the polishing layer, the polishing layer including a surface layer that forms at least an inner side of the recess, and a ratio (D1/D2) of an average opening ratio D1(%) to an average opening ratio D2(%) being 0.01 to 0.5, the average opening ratio D1 being an average opening ratio of the inner side of the recess when the polishing layer has been immersed in water at 23° C. for 1 hour, and the average opening ratio D2 being an average opening ratio of a cross section of the polishing layer that does not intersect the surface layer when the cross section has been immersed in water at 23° C. for 1 hour.

17 Claims, 2 Drawing Sheets

(51) Int. Cl.
 *B24B 37/24* (2012.01)
 *H01L 21/3105* (2006.01)
 *H01L 21/321* (2006.01)

(56) References Cited

U.S. PATENT DOCUMENTS

| | | | |
|---|---|---|---|
| 6,273,806 B1 | 8/2001 | Bennett et al. | |
| 6,520,847 B2 | 2/2003 | Osterheld et al. | |
| 6,645,061 B1 | 11/2003 | Bennett et al. | |
| 6,699,115 B2 | 3/2004 | Osterheld et al. | |
| 6,824,455 B2 | 11/2004 | Osterheld et al. | |
| 7,300,335 B2* | 11/2007 | Tajima et al. | 451/41 |
| 7,897,250 B2* | 3/2011 | Iwase et al. | 451/527 |
| 8,128,464 B2 | 3/2012 | Motonari et al. | |
| 2009/0075568 A1 | 3/2009 | Kimura et al. | |
| 2012/0083187 A1 | 4/2012 | Okamoto et al. | |

FOREIGN PATENT DOCUMENTS

| | | |
|---|---|---|
| JP | 2000 34416 | 2/2000 |
| JP | 2003 243343 | 8/2003 |
| JP | 3769581 | 4/2006 |
| WO | 2005 023487 | 3/2005 |

OTHER PUBLICATIONS

U.A. Appl. No. 14/254,395, filed Apr. 16, 2014, Okamoto, et al.
U.S. Appl. No. 13/518,230, filed Aug. 30, 2012, Yokoi, et al.

* cited by examiner

CHEMICAL-MECHANICAL POLISHING PAD AND CHEMICAL-MECHANICAL POLISHING METHOD

TECHNICAL FIELD

The present invention relates to a chemical mechanical polishing pad, and a chemical mechanical polishing method using the chemical mechanical polishing pad.

BACKGROUND ART

Chemical mechanical polishing (hereinafter may be referred to as "CMP") has attracted attention as a technique that can form a flat (planarized) surface when producing a semiconductor device. CMP is a technique that the surface (polishing surface) of a wafer on which devices and wires (interconnects) are formed, is polished chemically and mechanically with supplying a slurry to the surface of the chemical mechanical polishing pad, while sliding the polishing surface to come in contact with a polishing layer of a chemical mechanical polishing pad. It has been known that the removal rate, occurrence of scratches on the polishing surface, the in-plane uniformity of the polishing surface depends on the properties of the chemical mechanical polishing pad.

For example, JP-A-11-70463 discloses a chemical mechanical polishing pad that consists of a resin foam (e.g., polyurethane foam), and JP-A-2000-34416 discloses a chemical mechanical polishing pad prepared by dispersing water-soluble particles in a non-foaming matrix. Japanese Patent No. 3769581 discloses a technique that forms a recess in the polishing layer of the chemical mechanical polishing pad in order to achieve excellent polishing performance, and improves the fluidity of the slurry by improving the flatness of the inner side (e.g., side surface and bottom surface) of the recess.

SUMMARY OF THE INVENTION

Technical Problem

When a recess is formed in the polishing layer of the chemical mechanical polishing pad, however, a the slurry component (e.g., water) may enter the polishing layer through the inner side of the recess when the chemical mechanical polishing pad is exposed to the slurry for a long time during the chemical mechanical polishing process, so that deformation of the recess may occur. When deformation of the recess formed in the surface of the polishing layer has occurred, a deterioration in polishing performance (e.g., occurrence of scratches on the polishing surface during chemical mechanical polishing process, or a decrease in slurry distribution capability or waste discharge capability) may occur.

Several aspects of the invention may provide a chemical mechanical polishing pad that can maintain excellent polishing performance even when the chemical mechanical polishing pad is exposed to the slurry for a long time, and a chemical mechanical polishing method with the chemical mechanical polishing pad by solving the above problems

Solution to Problem

The invention was conceived in order to solve at least some of the above problems, and may be implemented by the following aspects or application examples.

Application Example 1

According to one aspect of the invention, a chemical mechanical polishing pad includes a polishing layer, a recess being formed in a polishing surface of the polishing layer, the polishing layer with a surface layer that includes at least an inner side of the recess, and a ratio (D1/D2) of an average opening ratio D1(%) to an average opening ratio D2(%) being 0.01 to 0.5, the average opening ratio D1 being an average opening ratio of the inner side of the recess when the polishing layer has been immersed in water at 23° C. for 1 hour, and the average opening ratio D2 being an average opening ratio of a cross section of the polishing layer that does not intersect the surface layer when the cross section has been immersed in water at 23° C. for 1 hour.

Application Example 2

In the chemical mechanical polishing pad according to Application Example 1, the average opening ratio D1(%) may be 0.1 to 20%.

Application Example 3

In the chemical mechanical polishing pad according to Application Example 1, the average opening ratio D2(%) may be 10 to 50%.

Application Example 4

In the chemical mechanical polishing pad according to Application Example 1, the inner side of the recess may have a surface roughness (Ra) of 1 to 10 micrometers.

Application Example 5

In the chemical mechanical polishing pad according to Application Example 1, the polishing surface of the polishing layer may have a silicon atom concentration or a fluorine atom concentration of 0.5 to 10 atom %, which is determined by subjecting the polishing surface of the polishing layer to elemental analysis using X-ray photoelectron spectroscopy (XPS).

Application Example 6

In the chemical mechanical polishing pad according to Application Example 1, the inner side of the recess may have a silicon atom concentration or a fluorine atom concentration of 0.5 to 10 atom %, which is determined by subjecting the inner side of the recess to elemental analysis using X-ray photoelectron spectroscopy (XPS).

Application Example 7

According to another aspect of the invention, a chemical mechanical polishing method is characterized by using the chemical mechanical polishing pad according to Application Example 1.

Advantageous Effects of the Invention

Since the chemical mechanical polishing pad can suppress entry of the slurry component through the inner side of the recess formed in the polishing layer even if the chemical mechanical polishing pad is exposed to the slurry for a long time during the chemical mechanical polishing process, the chemical mechanical polishing pad can maintain excellent polishing performance. Since the chemical mechanical polishing method relating to the invention utilizes the chemical mechanical polishing pad, constant polishing performance can be achieved even if the chemical mechanical polishing pad is exposed to the slurry for a long time during the chemical mechanical polishing process.

DESCRIPTION OF EMBODIMENTS

Preferred embodiments of the invention are described in detail below. Note that the invention is not limited to the following embodiments. Various modifications may be made of the following embodiments without departing from the scope of the invention.

1. Chemical Mechanical Polishing Pad

A chemical mechanical polishing pad according to one embodiment of the invention includes a polishing layer that forms at least one surface (side) of the chemical mechanical polishing pad. A recess is formed in a polishing surface (i.e., a surface that is used for polishing) of the polishing layer. The polishing layer has a surface layer that includes at least the inner side of the recess. An example of the chemical mechanical polishing pad according to one embodiment of the invention is described below with reference to the drawings.

Figure 1:
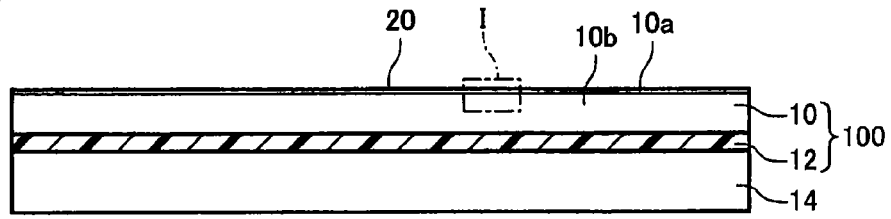
FIG. 1 is a cross-sectional view schematically illustrating a chemical mechanical polishing pad according to one embodiment of the invention.
Figure 1:
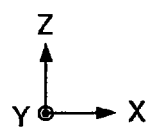

FIG. 1 is a cross-sectional view schematically illustrating an example of the chemical mechanical polishing pad according to one embodiment of the invention. As illustrated in FIG. 1, a chemical mechanical polishing pad 100 includes a polishing layer 10, and a support layer 12 that is provided on the opposite side of the polishing layer 10 and comes in contact with a polishing system platen 14.

1.1. Polishing Layer

The planar shape of the polishing layer 10 is not particularly limited. For example, the polishing layer 10 may have a circular planar shape. When the polishing layer 10 has a circular planar shape, the diameter of the polishing layer 10 is preferably 150 to 1200 mm, and more preferably 500 to 1000 mm. The thickness of the polishing layer 10 is preferably 0.5 to 5.0 mm, more preferably 1.0 to 4.0 mm, and particularly preferably 1.5 to 3.5 mm.

Figure 2:
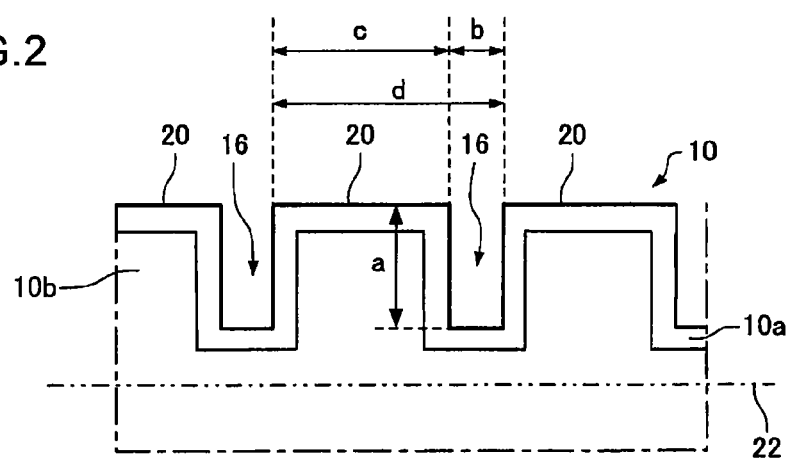
FIG. 2 is an enlarged view of the area I illustrated in FIG. 1.

FIG. 2 is an enlarged view of an area I illustrated in FIG. 1 (i.e., a cross-sectional view schematically illustrating the detailed shape of the polishing layer 10). As illustrated in FIG. 2, a plurality of recesses 16 is formed in a polishing surface 20. The recess 16 serves as a path that retains a slurry supplied during chemical mechanical polishing, uniformly distributes the slurry over the polishing surface 20, temporarily stores waste (e.g., polishing waste and spent slurry), and discharges the waste to the outside.

The cross-sectional shape of the recess 16 is not particularly limited. For example, the recess 16 may have a shape formed by a flat side and a flat bottom, a polygonal shape, a U-like shape, a V-like shape, or the like. The depth "a" of the recess 16 is preferably 0.1 mm or more, more preferably 0.1 to 2.5 mm, and particularly preferably 0.2 to 2.0 mm. The width "b" of the recess 16 is preferably 0.1 mm or more, more preferably 0.1 to 5.0 mm, and particularly preferably 0.2 to 3.0 mm. In a polishing surface 20, the interval "c" between the adjacent recesses 16 is preferably 0.05 mm or more, more preferably 0.05 to 100 mm, and particularly preferably 0.1 to 10 mm. The pitch "d" that is the sum of the width of the recess and the interval between the adjacent recesses is preferably 0.15 mm or more, more preferably 0.15 to 105 mm, and particularly preferably 0.6 to 13 mm. A chemical mechanical polishing pad that can reduce occurrence of scratches on the polishing surface, and has a long lifetime can be easily produced by forming the recesses 16 having the above shape.

The above preferable ranges may be arbitrarily combined. For example, it is preferable that the recesses have a depth "a" of 0.1 mm or more, a width "b" of 0.1 mm or more, and an interval "c" of 0.05 mm or more. It is more preferable that the recesses have a depth "a" of 0.1 to 2.5 mm, a width "b" of 0.1 to 5.0 mm, and an interval "c" of 0.05 to 100 mm. It is particularly preferable that the recesses have a depth "a" of 0.2 to 2.0 mm, a width "b" of 0.2 to 3.0 mm, and an interval "c" of 0.1 to 10 mm.

As illustrated in FIG. 2, the polishing layer 10 consists of a surface layer 10a and a deep layer 10b. The surface layer 10a forms the polishing surface 20 and the inner side of the recess 16 before the chemical mechanical polishing pad 100 is used. When the chemical mechanical polishing pad 100 is continuously used, the surface layer 10a that consists of the polishing surface 20 gradually wears out, and only the surface layer 10a that forms the inner side of the recess 16 remains. Therefore, the polishing layer 10 includes the surface layer 10a that forms at least the inner side of the recess 16 before and after the chemical mechanical polishing pad 100 is used. Note that the term "inner side" of the recess used herein means a side surface or bottom surface of the recess.

The surface layer 10a is preferably a layer up to a depth of 100 micrometers (more preferably 10 micrometers) from the polishing surface 20 or the inner side of the recess 16, for example, but is not limited to. Note that the deep layer 10b refers to a layer of the polishing layer 10 other than the surface layer 10a.

The chemical mechanical polishing pad 100 according to one embodiment of the invention has the following feature. The average opening ratio (%) of the inner side of the recess 16 when the polishing layer 10 has been immersed in water at 23° C. for 1 hour is referred to as D1. The average opening ratio (%) of the cross section of the polishing layer 10 that does not intersect the surface layer 10a when the cross section has been immersed in water at 23° C. for 1 hour, is referred to as D2. In this case, the ratio (D1/D2) of the average opening ratio D1 to the average opening ratio D2 is 0.01 to 0.5. The ratio (D1/D2) is preferably 0.1 to 0.4.

The chemical mechanical polishing pad 100 according to one embodiment of the invention with the above feature achieves the following advantageous effects. Specifically, the polishing surface 20 of the polishing layer 10 may have a higher average opening ratio by exposing the deep layer 10b when the surface layer 10a is removed by dressing or wear-out. As a result, the polishing surface 20 exhibits an improved slurry-retention capability, so that the removal rate can be improved. In contrast, since the surface layer 10a that forms the inner side of the recess 16 formed in the polishing layer 10 and has a low average opening ratio is not removed by dressing or wear-out, it is possible to suppress a situation in which the slurry component enters the polishing layer 10 through the inner side of the recess 16. This makes it possible to effectively prevent deformation of the recess 16 that may occur when the polishing layer 10 absorbs the slurry component and swells, so that the polishing performance does not deteriorate even if the chemical mechanical polishing process is performed for a long time. If the ratio (D1/D2) exceeds 0.5 (i.e., the difference between the average opening ratio D1 and the average opening ratio D2 is too small), the slurry-retention capability may not be improved even if the deep layer 10b is exposed, or the slurry component may enter the polishing layer 10 through the inner side of the recess 16, so that deformation of the recess 16 may occur.

Figure 3:
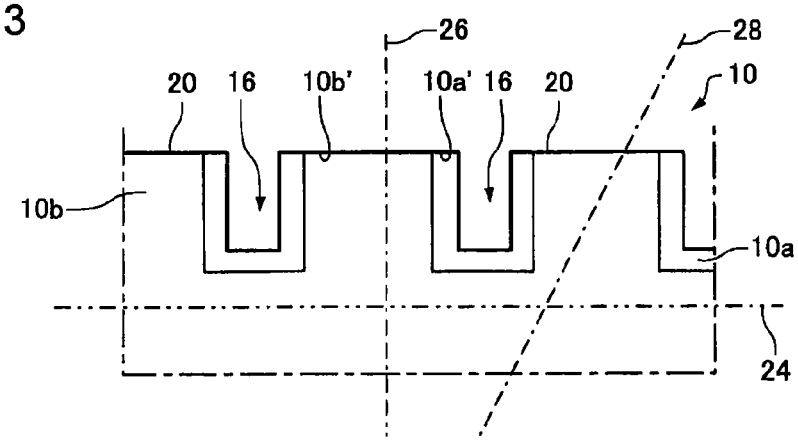
FIG. 3 is an enlarged view of the area I illustrated in FIG. 1 after the chemical mechanical polishing pad has been used.

FIG. 3 is an enlarged view of the area I illustrated in FIG. 1 (i.e., a cross-sectional view schematically illustrating the detailed shape of the polishing layer 10 after the chemical mechanical polishing pad 100 has been used). As illustrated in FIG. 3, the surface layer 10a is removed by dressing or wear-out when the chemical mechanical polishing pad 100 is continuously used, so that a deep layer 10b' is exposed. In this case, a surface layer 10a' is also exposed on the polishing surface 20 in addition to the deep layer 10b'. When CMP is performed in a state in the polishing surface 20, the surface layer 10a' and the deep layer 10b' have a different average opening ratio, so that a difference in slurry-retention capability occurs between the layers of the polishing surface 20 due to the difference in average opening ratio between the surface layer 10a' and the deep layer 10b', so that scratches and the like may occur.

In the state of FIG. 3, when the ratio (D1/D2) is within the above range, the difference in slurry-retention capability between the layers of the polishing surface 20 can be reduced, so that occurrence of scratches and the like can be reduced. If the ratio (D1/D2) is less than 0.01, a difference in slurry-retention capability occurs between the layers of the polishing surface 20 due to a large difference in average opening ratio between the surface layer 10a' and the deep layer 10b', so that scratches and the like may occur.

The average opening ratio D1(%) is preferably 0.1 to 20%, and more preferably 1 to 15%. When the average opening ratio D1 is within the above range, it is possible to easily suppress entry of the slurry component into the polishing layer 10 through the inner side of the recess 16. Therefore, since entry of the slurry component into the polishing layer 10 through the inner side of the recess 16 can be suppressed during chemical mechanical polishing that utilizes the slurry (i.e., aqueous dispersion of abrasive grains), deformation of the recess 16 can be prevented. As a result, occurrence of scratches on the polishing surface during chemical mechanical polishing process can be reduced. Moreover, since the slurry distribution capability and the waste discharge capability are not impaired, it may be possible to maintain stable polishing performance. Since the inner side of the recess 16 is not removed by wear-out even if the polishing layer 10 has worn out due to the chemical mechanical polishing process, entry of the slurry component into the polishing layer 10 through the inner side of the recess 16 can be suppressed. This makes it possible to effectively prevent deformation of the recess 16 that may occur when the polishing layer 10 absorbs the slurry component and swells, so that the polishing performance does not deteriorate even if the chemical mechanical polishing process is performed for a long time.

The average opening ratio D1(%) may be measured as described below. At first, water at 23° C. is put in a container, and the polishing layer 10 is immersed in the water for 1 hour. When the polishing layer 10 includes water-soluble particles, the water-soluble particles are dissolved in the water, so that openings are formed. An arbitrary three points (e.g., 1×1 mm rectangular range) of the inner side of the recess 16 are selected, and an image (magnification: 175) of the selected range is obtained using a microscope (e.g., "VH-6300" manufactured by Keyence Corporation). The resulting image is processed using image processing software (e.g., Image Analyzer V20LAB Ver. 1.3) to calculate the total area of the openings at each point, and the average opening area is calculated. The average opening ratio D1(%) is calculated by the following formula (1).

$$\text{Average opening ratio } D1(\%)=(\text{average opening area}/\text{area of entire image})\times 100 \quad (1)$$

The average opening ratio D2(%) is preferably 10 to 50%, and more preferably 20 to 40%. When the average opening ratio D2(%) is within the above range, the polishing surface 20 has a high average opening when the surface layer 10a is removed by dressing or wear-out, and the deep layer 10b is exposed. As a result, the polishing surface 20 exhibits an improved slurry-retention capability, so that the removal rate can be improved. When the average opening ratio D2(%) is within the above range, the deep layer 10b has a rigid structure, and the shape of the recess 16 is maintained. This may make it possible to improve the flatness of the polishing surface.

The average opening ratio D2(%) may be measured as described below. At first, the polishing layer 10 is cut along a plane that does not intersect the surface layer 10a of the polishing layer 10 to obtain a cross section. For example, when the surface layer 10a that includes the polishing surface 20 remains (see FIG. 2), the cross section may be a cross section 22 obtained by cutting the polishing layer 10 along a plane that is approximately parallel to the polishing surface 20. When the surface layer 10a that includes the polishing surface 20 has been removed, and the deep layer 10b' is exposed (see FIG. 3), the cross section may be a cross section 24 obtained by cutting the polishing layer 10 along a plane that is approximately parallel to the polishing surface 20, a cross section 26 obtained by cutting the polishing layer 10 along a plane that is approximately perpendicular to the polishing surface 20, or a cross section 28 obtained by diagonally cutting the polishing layer 10 between the adjacent recesses 16, for example. Note that the cross section of the polishing layer 10 that does not intersect the surface layer 10a is not limited to the examples illustrated in FIGS. 2 and 3. The cross section of the polishing layer 10 that does not intersect the surface layer 10a may be an arbitrary cross section of the polishing layer 10. The cross section thus obtained is the cross section of the deep layer 10b. Next, water at 23° C. is put in a container, and the cross section is immersed in the water for 1 hour. The subsequent procedure is the same as the procedure used when calculating the average opening ratio D1(%). The average opening ratio D2(%) may thus be calculated.

In the chemical mechanical polishing pad according to one embodiment of the invention, it is preferable that the polishing surface of the polishing layer have a silicon atom concentration or a fluorine atom concentration of 0.5 to 10 atom %, the silicon atom concentration or the fluorine atom concentration being determined by subjecting the polishing surface of the polishing layer to elemental analysis using X-ray photoelectron spectroscopy (XPS) wherein photoelectrons generated by applying X-rays to the polishing surface of the polishing layer are measured at a take-off angle of 90° with respect to the polishing surface of the polishing layer. In the chemical mechanical polishing pad 100 illustrated in FIG. 1, it is preferable that the surface layer 10a have a silicon atom concentration or a fluorine atom concentration of 0.5 to 10 atom %.

It is preferable that the surface layer 10a have a silicon atom concentration of 1 to 9 atom %, and more preferably 1.5 to 7 atom %. It is preferable that the surface layer 10a have a fluorine atom concentration of 1 to 9 atom %, and more preferably 1.5 to 7 atom %. When the silicon atom concentration or the fluorine atom concentration in the surface layer 10a is within the above range, the surface layer 10a exhibits hydrophobicity and hydrophilicity in a well-balanced manner, so that penetration of the slurry from the surface layer 10a into the deep layer 10b can be prevented without impairing the slurry-retention capability in the polishing process.

The total of the silicon atom concentration and the fluorine atom concentration in the surface layer 10a is preferably 0.5 to 10 atom %, and more preferably 1 to 9 atom %, since the above effects can be easily achieved.

When the chemical mechanical polishing pad 100 according to one embodiment of the invention includes the surface layer 10a so that the inner side of the recess 16 has a silicon atom concentration or a fluorine atom concentration of 0.5 to 10 atom %, the surface layer 10a that forms the inner side of the recess 16 is not removed by wear-out even if the polishing surface 20 has worn out in the polishing process. Therefore, the surface layer 10a in the inner side of the recess 16 prevents penetration of the slurry from the inner side of the recess 16 into the deep layer 10b in the polishing process. This makes it possible to effectively prevent deformation of the recess 16 that may occur when the deep layer 10b absorbs water and swells, so that the polishing performance does not deteriorate even if the chemical mechanical polishing process is performed for a long time.

It is preferable that the deep layer 10b of the polishing layer 10 have a silicon atom concentration and a fluorine atom concentration of 0 to 0.1 atom % from the viewpoint of suppressing contamination of the polishing target in the polishing process. It is more preferable that the deep layer 10b does not contain silicon and fluorine from the above viewpoint.

The silicon atom concentration and the fluorine atom concentration in the deep layer 10b may be determined as described below, for example. The polishing surface of the polishing layer 10 is subjected to argon ion etching to completely remove the surface layer 10a of the polishing layer 10, and expose the deep layer 10b. X-rays are applied to the surface of the deep layer 10b, and photoelectrons generated by applying X-rays are measured at a take-off angle of 90° with respect to the deep layer 10b using XPS to determine the silicon atom concentration and the fluorine atom concentration in the deep layer 10b.

Note that the silicon atom concentration used herein refers to the ratio of the number of silicon atoms to the total number (100 atom %) of atoms having an atomic number equal to or larger than the atomic number of a carbon atom that is quantitatively measured by XPS, and the fluorine atom concentration used herein refers to the ratio of the number of fluorine atoms to the total number (100 atom %) of atoms having an atomic number equal to or larger than the atomic number of a carbon atom that is quantitatively measured by XPS. The silicon atom concentration and the fluorine atom concentration in the polishing layer 10 are measured using XPS. The principle of XPS is briefly described below.

XPS is a spectroscopic method that measures the energy of photoelectrons released from the sample upon application of X-rays. Since photoelectrons immediately collide with molecules in air and are scattered, it is necessary to maintain the system under vacuum. Photoelectrons released in a deep layer of a solid sample are scattered inside the sample, and cannot escape through the surface of the sample. Therefore, since XPS measures only photoelectrons released through the surface of the sample, XPS is effective as a surface analysis method.

The kinetic energy E (i.e., a value obtained by subtracting the energy phi for moving electrons to the outside of the surface of the sample from hnu-$E_K$) of the observed photoelectrons is expressed by the following formula (2).

$$E = hnu - E_K - phi \quad (2)$$

where h is the Planck constant, nu is the frequency, and $E_K$ is the electron binding energy. As is clear from the formula (2), the value E differs depending on the energy of X-rays as the excitation source. The electron energy may be measured by an arbitrary method. The electron energy is typically measured by an electrostatic field method that guides electrons into an electrostatic field, and detects only the electrons that draw a constant orbital.

The electron binding energy $E_K$ can be measured by XPS. Since the binding energy is basically specific to each element, the type of each element can be specified based on the binding energy. It is also possible to quantitatively determine each element from the intensity of the photoelectron spectrum.

X-rays incident on the sample enter the sample through the surface of the sample. Since the mean free path of excited photoelectrons is as small as 0.1 to several 0.1 nanometers, photoelectrons are released only from the vicinity of the surface of the sample. This makes it possible to analyze the vicinity of the surface of the sample. However, when a number of layers are formed in the vicinity of the surface of the sample, it may be impossible to accurately detect the composition of each layer. This is because XPS observes the relative amount of the average composition from the surface to a depth of up to several tens of angstroms. In this case, the angular dependence of the escape depth of photoelectrons may be used. Specifically, photoelectrons are isotropically released from the surface of the sample, but the escape depth of photoelectrons from the solid surface differs depending on the take-off angle. The escape depth becomes a maximum by setting the take-off angle to 90° with respect to the surface of the sample, so that information about a deeper layer of the surface of the sample can be obtained. Note that the take-off angle refers to the angle formed by the surface of the sample and the detector.

A system used for XPS is not particularly limited as long as the system can qualitatively and quantitatively determine the elements present in the surface layer of the sample, and can analyze the chemical state. For example, an X-ray photoelectron spectroscope "Quantum 2000" (manufactured by ULVAC-PHI, Incorporated) or the like may be used.

It is preferable that the inner side of the recess 16 have a surface roughness (Ra) of 1 to 10 micrometers. When the surface roughness (Ra) of the inner side of the recess 16 is within the above range, asperity that may cause scratches during chemical mechanical polishing, are not substantially present on the inner side of the recess 16. When asperities (particularly large elevations (e.g., a cutting residue that may occur when forming the recess 16)) are present, the elevations may be removed during CMP, so that scratches may occur on the polishing surface. Foreign material that is formed when the removed elevations are compressed due to the polishing pressure, frictional heat, or the like, or foreign material that is formed due to interaction between the removed elevations and polishing waste, a solid component contained in the slurry, or the like may also cause scratches. The elevations may also be removed during dressing, and may cause a similar problem.

When the surface roughness (Ra) of the inner side of the recess 16 is within the above range, it is possible to allow the recess 16 to efficiently exhibit its functions (particularly the function of distributing the slurry over the polishing surface, and the function of discharging waste to the outside) while preventing occurrence of scratches.

The surface roughness (Ra) of the inner side of the recess 16 may be measured as described below. The roughness profile (5 sections) of arbitrary areas of the inner side of the recess formed in the polishing layer of the chemical mechanical polishing pad before use is measured twice in the vertical direction and the transverse direction at a speed of 0.5 mm/s and a reference length of 0.8 mm using a surface roughness tester (e.g., "SURFTEST" manufactured by Mitutoyo Corporation). The average value of the absolute values of the deviation from the average line to the measurement curve is calculated from the roughness profile as the surface roughness (Ra) of the inner side of the recess.

Figure 4:
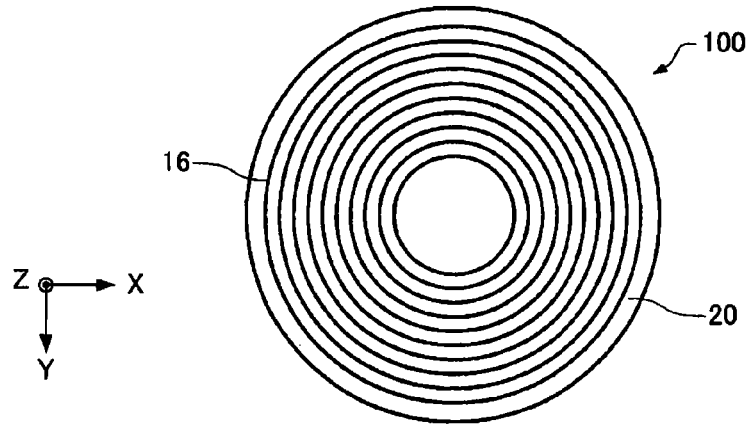
FIG. 4 is a plan view schematically illustrating a chemical mechanical polishing pad according to one embodiment of the invention.

FIG. 4 is a plan view illustrating the chemical mechanical polishing pad 100 according to one embodiment of the invention. As illustrated in FIG. 4, the recesses 16 may be formed in the shape of a plurality of concentric circles that gradually increase in diameter from the center of the polishing surface 20 toward the outer edge.

Figure 5:
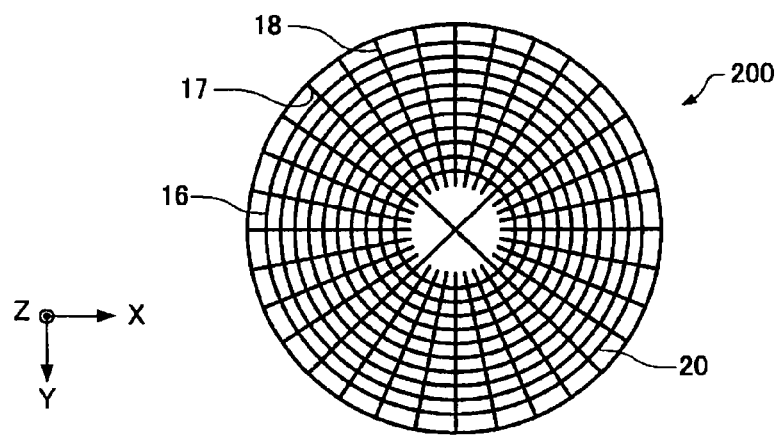
FIG. 5 is a plan view schematically illustrating a chemical mechanical polishing pad according to a first modification.

FIG. 5 is a plan view illustrating a chemical mechanical polishing pad 200 according to a first modification, and corresponding to FIG. 4. The chemical mechanical polishing pad 200 according to the first modification differs from the chemical mechanical polishing pad 100 in that the chemical mechanical polishing pad 200 further includes a plurality of recesses 17 and 18 that extend radially from the center of the polishing surface 20 toward the outer edge in addition to the circular recesses 16. The term "center area" used herein refers to an area that is enclosed by a circle having a radius of 50 mm and formed around the center of gravity of the polishing layer. The recesses 17 and 18 extend from an arbitrary position within the center area toward the outer edge. The recesses 17 and 18 may have a linear shape, an arc shape, or a combination thereof, for example. The recesses 17 and 18 may have a cross-sectional shape similar to that of the recesses 16. The remaining configuration of the chemical mechanical polishing pad 200 according to the first modification is the same as the configuration of the polishing layer 10 described with reference to FIGS. 1 to 3. Therefore, description thereof is omitted.

Figure 6:
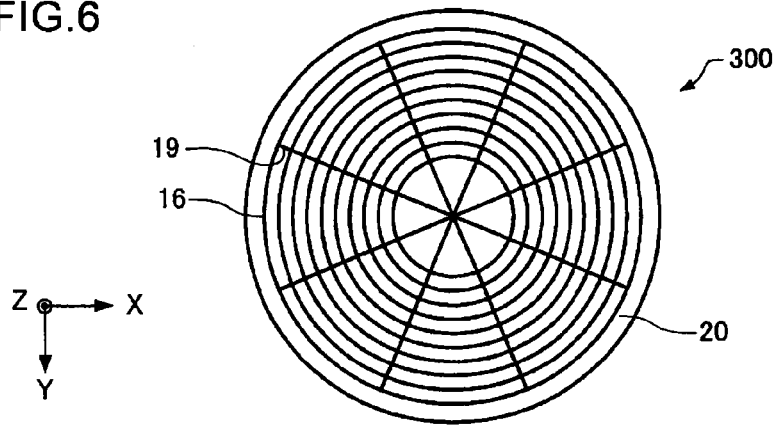
FIG. 6 is a plan view schematically illustrating a chemical mechanical polishing pad according to a second modification.

FIG. 6 is a plan view illustrating a chemical mechanical polishing pad 300 according to a second modification, and corresponding to FIG. 4. The chemical mechanical polishing pad 300 according to the second modification differs from the chemical mechanical polishing pad 100 in that the chemical mechanical polishing pad 300 further includes a plurality of recesses 19 that extend radially from the center of the polishing surface 20 toward the outer edge in addition to the circular recesses 16. The recesses 19 may have a cross-sectional shape similar to that of the recesses 16. The remaining configuration of the chemical mechanical polishing pad 300 according to the second modification is the same as the configuration of the polishing layer 10 described with reference to FIGS. 1 to 3. Therefore, description thereof is omitted.

Note that the planar shape of the recess is not limited to those described above. The planar shape of the recess may be appropriately optimized corresponding to the polishing target. For example, the planar shape of the recess may be a polygonal shape (e.g., triangle, quadrangle, or pentagon), an elliptical shape, a helical shape, or the like. The number of recesses formed in the polishing surface is not particularly limited.

The polishing layer 10 may consist of an arbitrary material as long as the object of the invention can be achieved. The recess 16 has the retention capability of the slurry during chemical mechanical polishing, and the function of temporarily storing polishing waste. In order to maintain the slurry-retention capability and the removal rate for a long time during chemical mechanical polishing, it is preferable that holes (pores) be formed in the polishing layer 10 during chemical mechanical polishing. Therefore, it is preferable that the polishing layer 10 be formed of a material that includes a water-insoluble matrix in which water-soluble particles are dispersed, or a material that includes a water-insoluble matrix in which holes (pores) are dispersed (e.g., foam).

1.2. Support Layer

In the chemical mechanical polishing pad 100, the support layer 12 is used to hold (support) the polishing layer 10 on the polishing system platen 14. The support layer 12 may be an adhesive layer, or may be a cushion layer that is provided with an adhesive layer on each side.

The adhesive layer may include a pressure-sensitive adhesive sheet, for example. The thickness of the pressure-sensitive adhesive sheet is preferably 50 to 250 micrometers. When the pressure-sensitive adhesive sheet has a thickness of 50 micrometers or more, a pressure applied to the polishing surface 20 of the polishing layer 10 can be sufficiently reduced. When the pressure-sensitive adhesive sheet has a thickness of 250 micrometers or less, it is possible to obtain a chemical mechanical polishing pad 100 having such a uniform thickness that the polishing performance is not affected by asperity.

A material that forms the pressure-sensitive adhesive sheet is not particularly limited as long as the polishing layer 10 can be secured on the polishing system platen 14. It is preferable that the pressure-sensitive adhesive sheet be formed of an acrylic material or a rubber material having a modulus of elasticity lower than that of the polishing layer 10.

The adhesive strength of the pressure-sensitive adhesive sheet is not particularly limited as long as the chemical mechanical polishing pad 100 can be fixed on the polishing system platen 14. It is preferred that the pressure-sensitive adhesive sheet have an adhesive strength measured in accordance with JIS Z 0237 of 3 N/25 mm or more, more preferably 4 N/25 mm or more, and particularly preferably 10 N/25 mm or more.

A material that forms the cushion layer is not particularly limited as long as the material has a hardness lower than that of the polishing layer 10. The cushion layer may be formed of a porous body (foam) or a non-porous body. Examples of the cushion layer include a layer obtained by forming polyurethane foam or the like. The thickness of the cushion layer is preferably 0.1 to 5.0 mm, and more preferably 0.5 to 2.0 mm.

2. Production Method Chemical Mechanical Polishing Pad

The chemical mechanical polishing pad according to one embodiment of the invention may be produced by a molding method using a mold, or a method that coats the surface of the polishing layer with a non-foaming material, for example. An example of the production method the chemical mechanical polishing pad is described below.

A resin foam block (e.g., polyurethane foam) is prepared, and sliced. Pluralities of recesses are formed in the surface of the resin foam block by cutting or the like, and a non-foaming material is applied to the surface of the resin foam block. According to the above method, the surface layer is formed by applying the non-foaming material to the inner side of each recess, and then the chemical mechanical polishing pad can be produced.

The chemical mechanical polishing pad according to one embodiment of the invention may also be produced by a method that includes providing a composition that includes at least a polyurethane and molding the composition using a mold. It is preferable that the surface of the mold is coated with a material that includes at least one element selected from silicon and fluorine, in order to efficiently produce the chemical mechanical polishing pad. An example of the production method for the chemical mechanical polishing pad using the mold is described below.

At first, a mold for molding the polishing layer is provided. A material of the mold is not particularly limited. Examples of the material of the mold include aluminum, carbon steel, tool steel, ceramics, and the like. The surface shape of the mold may be flat, but it is preferable that the surface of the mold is provided with a recess pattern for forming the recess shape as described in the section "1. Chemical mechanical polishing pad". When the mold is provided with such a recess pattern, the recess pattern can be efficiently transferred to the polishing layer.

The shape of the recess pattern is not particularly limited. For example, the recess pattern may have a helical planar shape, a circular planar shape, a grid-like planar shape, or the like. When the recess pattern has a circular planar shape, the diameter of the circle is preferably 1 to 1100 mm, more preferably 1 to 1000 mm, and particularly preferably 2 to 850 mm. When the recess pattern has a helical planar shape, a circular planar shape, or a grid-like planar shape, the width of the recess is preferably 0.1 to 5.0 mm, and more preferably 0.2 to 3.0 mm. The depth of the recess is preferably 0.1 to 2.5 mm, more preferably 0.2 to 2.0 mm, and particularly preferably 0.2 to 1.5 mm, irrespective of the shape of the recess pattern. The recess pattern may include one line or protrusion, or may include two or more lines or protrusions.

The arithmetic surface roughness (Ra) of the surface of the mold is preferably 20 micrometers or less, and more preferably 15 micrometers or less, from the viewpoint of improving the removability of the polishing layer from the mold. The arithmetic surface roughness of the surface of the mold may be measured using an optical surface roughness tester or a contact surface roughness tester, for example. Examples of the optical surface roughness tester include a three-dimensional surface structure analysis microscope, a scanning laser microscope, an electron surface morphology analyzer, and the like. Examples of the contact surface roughness tester include a probe-type surface roughness tester and the like.

Next, a composition that includes at least polyurethane is provided. The polyurethane is not particularly limited, but is preferably a thermoplastic polyurethane. An additive such as water-soluble particles, a crosslinking agent, a crosslinking promoter, an organic filler, or an inorganic filler may optionally be added to the composition.

The mold is charged with the composition, and the polishing layer is formed by compression molding, extrusion, or the like. When the composition includes a crosslinking agent, the mold may be heated in advance to a temperature of preferably 160 to 220° C., and more preferably 170 to 220° C. so that crosslinking occurs. When the composition does not include a crosslinking agent, the polishing layer may be molded by a method wherein the composition is plasticized, molded using a press or an injection molding machine, and solidified by cooling, or a method wherein the composition is plasticized/sheeted using an extruder equipped with a T-mold. When the surface shape of the mold is flat, a recess may be formed by cutting or the like after molding.

Finally, a non-foaming material is then applied to the surface of the polishing layer. The surface layer can thus be formed on the surface (polishing surface and inner side of recess) of the polishing layer. The non-foaming material is preferably a material that includes at least one element selected from silicon and fluorine. Specific examples of the non-foaming material include a composition that includes at least one element or compound selected from silicon, silicones, silicon dioxide, silicon nitride, silicic acid, silicon carbide, silicates, silicon resins, organosilanes, siloxides, silyl hydrides, silenes, polytetrafluoroethylene, polyvinylidene fluoride, fluororesins, metal fluorides, and nonmetal fluorides.

When using the mold, it is preferable to apply a material that includes at least one element selected from silicon and fluorine to the surface of the mold in advance in order to efficiently mold the polishing layer.

The mold may also be subjected to an arbitrary surface treatment instead of, or in addition to, applying a material that includes at least one element selected from silicon and fluorine. Examples of such an arbitrary surface treatment include electroplating, hot-dip plating, diffusion plating, deposition plating, electroless plating, thermal spraying, a chemical conversion treatment, flame hardening, high-frequency hardening, carburization, nitridation, electron beam hardening, laser hardening, and shot peening.

3. Chemical Mechanical Polishing Method Using Chemical Mechanical Polishing Pad A chemical mechanical polishing method according to one embodiment of the invention includes chemically and mechanically polishing a polishing target using the chemical mechanical polishing pad according to one embodiment of the invention. Since the chemical mechanical polishing pad can suppress entry of the slurry component through the inner side of the recess formed in the polishing layer even if the chemical mechanical polishing pad is exposed to the slurry for a long time during the chemical mechanical polishing process, the chemical mechanical polishing pad can maintain excellent polishing performance. Since the chemical mechanical polishing method according to one embodiment of the invention utilizes the chemical mechanical polishing pad according to one embodiment of the invention, constant polishing performance can be achieved even if the chemical mechanical polishing pad is exposed to the slurry for a long time during the chemical mechanical polishing process.

The chemical mechanical polishing method according to one embodiment of the invention may be implemented using a commercially available chemical mechanical polishing system. Examples of the commercially available chemical mechanical polishing system include EPO-112 and EPO-222 (manufactured by Ebara Corporation); LGP-510 and LGP-552 (manufactured by Lapmaster SFT); Mirra (manufactured by Applied Materials); and the like.

Appropriate slurry may be selected depending on the polishing target (e.g., copper film, insulating film, or low-dielectric-constant insulating film).

4. Examples

4.1 Example 1

35 parts by mass of a thermoplastic polyurethane ("Elastollan 1174D" manufactured by BASF JAPAN LTD.), 35 parts by mass of a thermoplastic polyurethane ("Elastollan NY97A" manufactured by BASF JAPAN LTD.), and 30 parts by mass of beta-cyclodextrin ("Dexy Pearl beta-100" manufactured by Ensuiko Sugar Refining Co., Ltd.) (water-soluble particles) were kneaded using an extruder heated to 180° C. to prepare a thermoplastic polyurethane composition. A mold (material: S55C) with concentric circular ribs (width: 0.5 mm, height: 1.4 mm, and pitch: 1.5 mm), and provided with a silicon-based resin surface coating (about 1 micrometer), was provided. The mold was charged with the composition, and the composition was compression-molded at 180° C. to obtain a disc-like chemical mechanical polishing pad (diameter: 845 mm, thickness: 3.1 mm, recess width: 0.5 mm, recess depth: 1.4 mm, recess pitch: 1.5 mm). No breakage was observed on the surface of the chemical mechanical polishing pad (i.e., the moldability was good).

The chemical mechanical polishing pad was immersed in water at 23° C. for 1 hour. An arbitrary three points (e.g., 1×1 mm rectangular range) of the inner side of the recess were selected, and an image (magnification: 175) of the selected range was obtained using a microscope ("VH-6300" manufactured by Keyence Corporation). The resulting image was processed using image processing software (e.g., Image Analyzer V20LAB Ver. 1.3) to calculate the total area of the openings at each point, and the average opening area was calculated. The average opening ratio D1(%) was calculated by the following formula (1). The results are shown in Table 1.

$$\text{Average opening ratio } D1(\%) = (\text{average opening area}/\text{area of entire image}) \times 100 \quad (1)$$

The chemical mechanical polishing pad was cut along an arbitrary plane that does not intersect the surface layer to obtain a cross section, which was smoothed using a microtome. The cross section was immersed in water at 23° C. for 1 hour. An arbitrary three points (e.g., 1×1 mm rectangular range) of the cross section were selected, and an image (magnification: 175) of the selected range was obtained using a microscope ("VH-6300" manufactured by Keyence Corporation). The subsequent operation was performed in the same manner as in the case of calculating the average opening ratio D1(%) to calculate the average opening ratio D2(%). The results are shown in Table 1.

The roughness profile (5 sections) of arbitrary areas of the inner side of the recess formed in the polishing surface was measured twice in the vertical direction and the transverse direction at a speed of 0.5 mm/s and a reference length of 0.8 mm using a surface roughness tester ("SURFTEST" manufactured by Mitutoyo Corporation). The average value of the absolute values of the deviation from the average line to the measurement curve was calculated from the roughness profile as the surface roughness (Ra). The results are shown in Table 1.

Table 1 shows the average values of the silicon atom concentration and the fluorine atom concentration measured at an arbitrary three points of the surface layer of the polishing layer of the chemical mechanical polishing pad using an X-ray photoelectron spectroscope ("Quantum 2000" manufactured by ULVAC-PHI, Incorporated).

The surface layer of the polishing layer of the chemical mechanical polishing pad was subjected to argon ion etching for 5 minutes (accelerating voltage: 5 kV) using the X-ray photoelectron spectroscope. Table 1 shows the average values of the silicon atom concentration and the fluorine atom concentration measured at an arbitrary three points of the etched surface (deep layer) using the X-ray photoelectron spectroscope.

The chemical mechanical polishing pad was installed in a chemical mechanical polishing system ("Applied Reflexion LK" manufactured by Applied Materials), and a polishing test was repeatedly performed under the following conditions. Table 1 shows the removal rate evaluation results obtained by the tenth polishing test, and the removal rate evaluation results obtained by the 200th polishing test. When the removal rate was 200 nm/min or more, the polishing performance was evaluated as "Acceptable". When removal rate was less than 200 nm/min, the polishing performance was evaluated as "Unacceptable".

Initial Dressing
Platen rotation speed: 120 rpm
Deionized water supply rate: 100 ml/min
Polishing time: 600 seconds
Evaluation of Removal Rate A 12-inch wafer provided with a PETEOS film (polishing target) was subjected to chemical mechanical polishing under the following conditions. Note that the PETEOS film is a silicon oxide film formed by plasma-enhanced chemical vapor deposition using tetraethylorthosilicate (TEOS) as a raw material.

Platen rotation speed: 120 rpm
Polishing head rotational speed: 36 rpm
Polishing head pressure: 240 hPa
Slurry supply rate: 300 ml/min
Polishing time: 60 seconds
Slurry: CMS1101 (manufactured by JSR Corporation)

The thickness of the PETEOS film was measured before and after chemical mechanical polishing at an evenly distributed thirty-three points excluding a range of 5 mm from each end in the diametrical direction. The removal rate was calculated from the measurement results using the following formulas (3) and (4).

$$\text{Polishing amount (nm)} = \text{thickness before polishing (nm)} - \text{thickness after polishing (nm)} \quad (3)$$

$$\text{Removal rate (nm/min)} = \text{average amount of polishing at 33 points (nm)}/\text{polishing time (min)} \quad (4)$$

The ratio of the removal rate of the 200th polishing test to the removal rate of the tenth polishing test (hereinafter may be referred to as "removal rate ratio") was calculated by the following formula (5). When the removal rate ratio was 0.95 or more, the polishing performance was evaluated as "Acceptable" (i.e., the polishing performance could be maintained). When the removal rate ratio was less than 0.95, the polishing performance was evaluated as "Unacceptable" (i.e., the polishing performance could not be maintained).

$$\text{Removal rate ratio} = (\text{removal rate of 200th polishing test})/(\text{removal rate of tenth polishing test}) \quad (5)$$

Evaluation of Scratches

A polishing target (test substrate) was prepared by forming a PETEOS film (thickness: 500 nm) on a silicon substrate, forming a mask pattern ("SEMATECH 854"), and sequentially forming a tantalum nitride film (thickness: 25 nm) and a copper film (thickness: 1100 nm) over the mask pattern.

Chemical mechanical polishing was performed in the same manner as in the section "Evaluation of removal rate", except that the polishing target was changed. The number of scratches that occurred on the entire polishing surface after polishing was counted using a wafer defect inspection system ("KLA 2351" manufactured by KLA-Tencor Corporation). Note that occurrence of scratches was evaluated using the wafers used in the tenth polishing test and the 200th polishing test. Table 1 shows the scratch evaluation results obtained by the tenth polishing test, and the scratch evaluation results obtained by the 200th polishing test. When the number of scratches was 20 or less, the polishing performance was evaluated as "Acceptable". When the number of scratches was more than 20, the polishing performance was evaluated as "Unacceptable".

4.2. Example 2

A chemical mechanical polishing pad was produced in the same manner as in Example 1, except that 40 parts by mass of a thermoplastic polyurethane ("Elastollan 1174D" manufactured by BASF JAPAN LTD.), 40 parts by mass of a thermoplastic polyurethane ("Elastollan NY97A" manufactured by BASF JAPAN LTD.), and 20 parts by mass of beta-cyclodextrin ("Dexy Pearl beta-100" manufactured by Ensuiko Sugar Refining Co., Ltd.) (water-soluble particles) were kneaded using an extruder heated to 180° C. to prepare a thermoplastic polyurethane composition. The properties of the chemical mechanical polishing pad and the evaluation results are shown in Table 1.

4.3. Example 3

A chemical mechanical polishing pad was produced in the same manner as in Example 1, except that 20 parts by mass of a thermoplastic polyurethane ("Elastollan 1174D" manufactured by BASF JAPAN LTD.), 20 parts by mass of a thermoplastic polyurethane ("Elastollan NY97A" manufactured by BASF JAPAN LTD.), and 60 parts by mass of beta-cyclodextrin ("Dexy Pearl beta-100" manufactured by Ensuiko Sugar Refining Co., Ltd.) (water-soluble particles) were used, and 15 g of a spray-type silicon compound-containing release agent ("Permalease 10" manufactured by Schill+Seilacher GmbH) was sprayed to the surface of the mold before molding. The properties of the chemical mechanical polishing pad and the evaluation results are shown in Table 1.

4.4 Example 4

A mold that had the same shape as that of the mold used in Example 1 and was not subjected to a surface treatment was provided, and 15 g of a spray-type silicon compound-containing release agent ("Permalease 10" manufactured by Schill+Seilacher GmbH) was sprayed to the surface of the mold. A chemical mechanical polishing pad was produced in the same manner as in Example 2, except that the above mold was used. The properties of the chemical mechanical polishing pad and the evaluation results are shown in Table 1.

4.5. Example 5

A fluorine-coated reaction vessel was charged with 100 parts by mass of a filtered polyether-based prepolymer ("Adiprene L-325" manufactured by Chemtura corporation) and 3 parts by mass of a filtered silicone-based surfactant ("SH192" manufactured by Dow Corning Toray Co., Ltd.), and the temperature of the mixture was adjusted to 80° C. The mixture was then vigorously stirred at 900 rpm for about 4 minutes using a fluorine-coated stirrer so that bubbles were introduced into the reaction system. After the addition of 26 parts by mass of 4,4'-methylenebis(o-chloroaniline) ("Iharacuamine MT" manufactured by Ihara Chemical Industry Co., Ltd.) (that was melted at 120° C. and filtered), the mixture was stirred for about 1 hour. The mold used in Example 1 was charged with the reaction mixture, and the reaction mixture was heated at 110° C. to obtain a chemical mechanical polishing pad. The properties of the chemical mechanical polishing pad and the evaluation results are shown in Table 1.

4.6. Example 6

A mold with a flat surface (i.e., which was not provided with a rib) was provided. The mold was charged with the thermoplastic polyurethane composition obtained in Example 2, and the thermoplastic polyurethane composition was compression-molded at 180° C. to obtain a chemical mechanical polishing pad material. The material was subjected to a sander treatment, and recesses were formed by cutting to obtain a disc-like chemical mechanical polishing pad (diameter: 845 mm, thickness: 3.1 mm, recess width: 0.5 mm, recess depth: 1.4 mm, recess pitch: 1.5 mm). 2 g of a spray-type silicon compound-containing release agent ("Permalease 10" manufactured by Schill+Seilacher) was sprayed to the polishing surface of the polishing layer of the chemical mechanical polishing pad. The target chemical mechanical polishing pad was thus obtained. The properties of the chemical mechanical polishing pad and the evaluation results are shown in Table 1.

4.7. Example 7

A chemical mechanical polishing pad was produced in the same manner as in Example 6, except that 3 g of a spray-type silicon compound-containing release agent ("Permalease 10" manufactured by Schill+Seilacher GmbH) was sprayed to the polishing surface. The properties of the chemical mechanical polishing pad and the evaluation results are shown in Table 1.

4.8. Example 8

A chemical mechanical polishing pad was produced in the same manner as in Example 2, except that a mold (material: S55C) provided with a fluorine-based resin surface coating (about 5 micrometers) was used. The properties of the chemical mechanical polishing pad and the evaluation results are shown in Table 1.

4.9. Example 9

A chemical mechanical polishing pad was produced in the same manner as in Example 6, except that 2 g of a spray-type fluorine-based compound-containing release agent ("Frelease 20" manufactured by NEOS Co., Ltd.) was sprayed to the polishing surface. The properties of the chemical mechanical polishing pad and the evaluation results are shown in Table 1.

4.10. Example 10

A chemical mechanical polishing pad was produced in the same manner as in Example 6, except that 2 g of a spray-type silicon compound/fluorine-based compound-containing release agent ("Frelease 11F" manufactured by NEOS Co., Ltd.) was sprayed to the polishing surface. The properties of the chemical mechanical polishing pad and the evaluation results are shown in Table 1.

4.11. Comparative Example 1

A mold with a flat surface (i.e., which was not provided with a rib) was provided. The mold was charged with the thermoplastic polyurethane composition obtained in Example 1, and the thermoplastic polyurethane composition was compression-molded at 180° C. to obtain a chemical mechanical polishing pad material. The material was subjected to a sander treatment, and recesses were formed by cutting to obtain a disc-like chemical mechanical polishing pad (diameter: 845 mm, thickness: 3.1 mm, recess width: 0.5 mm, recess depth: 1.4 mm, recess pitch: 1.5 mm). The properties of the chemical mechanical polishing pad and the evaluation results are shown in Table 1.

4.12. Comparative Example 2

A mold with a flat surface (i.e., which was not provided with a rib) was provided. The mold was charged with the thermoplastic polyurethane composition obtained in Example 3, and the thermoplastic polyurethane composition was compression-molded at 180° C. to obtain a chemical mechanical polishing pad material. The material was subjected to a sander treatment, and recesses were formed by cutting to obtain a disc-like chemical mechanical polishing pad (diameter: 845 mm, thickness: 3.1 mm, recess width: 0.5 mm, recess depth: 1.4 mm, recess pitch: 1.5 mm). The properties of the chemical mechanical polishing pad and the evaluation results are shown in Table 1.

4.13. Comparative Example 3

A mold with a flat surface (i.e., which was not provided with a rib) was provided. The mold was charged with the composition obtained in Example 5, and the composition was heated at 110° C. to obtain a chemical mechanical polishing pad material. The material was subjected to a sander treatment, and recesses were formed by cutting to obtain a disc-like chemical mechanical polishing pad (diameter: 845 mm, thickness: 3.1 mm, recess width: 0.5 mm, recess depth: 1.4 mm, recess pitch: 1.5 mm). The properties of the chemical mechanical polishing pad and the evaluation results are shown in Table 1.

4.14. Comparative Example 4

A chemical mechanical polishing pad was produced in the same manner as in Example 2, except that beta-cyclodextrin was not added when preparing the thermoplastic polyurethane composition. The properties of the chemical mechanical polishing pad and the evaluation results are shown in Table 1.

TABLE 1

| | | | Example 1 | Example 2 | Example 3 | Example 4 | Example 5 |
|---|---|---|---|---|---|---|---|
| Properties | | Average opening ratio D1 (%) | 2 | 2 | 15 | 5 | 1 |
| of | | Average opening ratio D2 (%) | 20 | 17 | 40 | 14 | 20 |
| polishing | | D1/D2 | 0.10 | 0.12 | 0.38 | 0.36 | 0.05 |
| layer | | Surface roughness (micrometers) | 2.1 | 1.9 | 7.6 | 1.8 | 2.1 |
| | Surface layer | Silicon atom concentration (atom %) | 0.6 | 0.9 | 1.0 | 1.9 | 0.7 |
| | | Fluorine atom concentration (atom %) | ND | ND | ND | ND | ND |
| | Deep layer | Silicon atom concentration (atom %) | ND | ND | ND | ND | ND |
| | | Fluorine atom concentration (atom %) | ND | ND | ND | ND | ND |
| Evaluation | Tenth test | Removal rate | Acceptable | Acceptable | Acceptable | Acceptable | Acceptable |
| results | | Scratches | Acceptable | Acceptable | Acceptable | Acceptable | Acceptable |
| | 200th test | Removal rate | Acceptable | Acceptable | Acceptable | Acceptable | Acceptable |
| | | Scratches | Acceptable | Acceptable | Acceptable | Acceptable | Acceptable |
| | | Removal rate ratio | Acceptable | Acceptable | Acceptable | Acceptable | Acceptable |

| | | | Example 6 | Example 7 | Example 8 | Example 9 | Example 10 |
|---|---|---|---|---|---|---|---|
| Properties | | Average opening ratio D1 (%) | 4 | 4 | 2 | 6 | 4 |
| of | | Average opening ratio D2 (%) | 15 | 14 | 17 | 12 | 15 |
| polishing | | D1/D2 | 0.27 | 0.29 | 0.12 | 0.50 | 0.27 |
| layer | | Surface roughness (micrometers) | 3.4 | 3.2 | 1.9 | 5.6 | 3.4 |
| | Surface layer | Silicon atom concentration (atom %) | 6.5 | 9.1 | ND | ND | 4.3 |
| | | Fluorine atom concentration (atom %) | ND | ND | 0.8 | 8.3 | 3.9 |
| | Deep layer | Silicon atom concentration (atom %) | ND | ND | ND | ND | ND |
| | | Fluorine atom concentration (atom %) | ND | ND | ND | ND | ND |
| Evaluation | Tenth test | Removal rate | Acceptable | Acceptable | Acceptable | Acceptable | Acceptable |
| results | | Scratches | Acceptable | Acceptable | Acceptable | Acceptable | Acceptable |
| | 200th test | Removal rate | Acceptable | Acceptable | Acceptable | Acceptable | Acceptable |
| | | Scratches | Acceptable | Acceptable | Acceptable | Acceptable | Acceptable |
| | | Removal rate ratio | Acceptable | Acceptable | Acceptable | Acceptable | Acceptable |

TABLE 1-continued

|  |  |  | Comparative Example 1 | Comparative Example 2 | Comparative Example 3 | Comparative Example 4 |
|---|---|---|---|---|---|---|
| Properties of polishing layer |  | Average opening ratio D1 (%) | 19 | 39 | 19 | 0 |
|  |  | Average opening ratio D2 (%) | 21 | 41 | 19 | 0 |
|  |  | D1/D2 | 0.90 | 0.95 | 1.00 | — |
|  |  | Surface roughness (micrometers) | 9.0 | 13.0 | 8.8 | 1.9 |
|  | Surface layer | Silicon atom concentration (atom %) | ND | ND | ND | 0.9 |
|  |  | Fluorine atom concentration (atom %) | ND | ND | ND | ND |
|  | Deep layer | Silicon atom concentration (atom %) | ND | ND | ND | ND |
|  |  | Fluorine atom concentration (atom %) | ND | ND | ND | ND |
| Evaluation results | Tenth test | Removal rate | Acceptable | Unacceptable | Acceptable | Unacceptable |
|  |  | Scratches | Acceptable | Acceptable | Acceptable | Acceptable |
|  | 200th test | Removal rate | Acceptable | Unacceptable | Acceptable | Unacceptable |
|  |  | Scratches | Unacceptable | Unacceptable | Unacceptable | Acceptable |
|  |  | Removal rate ratio | Acceptable | Unacceptable | Unacceptable | — |

4.15. Evaluation Results

In the chemical mechanical polishing pads obtained in Examples 1 to 10 that included the surface layer forming the inner side of each recess, the ratio (D1/D2) of the average opening ratio D1 to the average opening ratio D2 was 0.01 to 0.5. When using the chemical mechanical polishing pads obtained in Examples 1 to 10, the removal rate obtained by the 200th polishing test was almost equal to the removal rate obtained by the tenth polishing test. When using the chemical mechanical polishing pads obtained in Examples 1 to 10, the number of scratches could be suppressed to 20 or less even in the 200th polishing test. It was thus confirmed that the chemical mechanical polishing pad which included the surface layer forming the inner side of the recess, and in which the ratio (D1/D2) of the average opening ratio D1 to the average opening ratio D2 was 0.01 to 0.5, could suppress entry of the slurry component through the inner side of the recess, so that the polishing performance was maintained even if chemical mechanical polishing was repeatedly performed.

In the chemical mechanical polishing pads obtained in Comparative Examples 1 and 2, the ratio (D1/D2) of the average opening ratio D1 to the average opening ratio D2 was more than 0.5. As a result, the number of scratches exceeded 20 in the 200th polishing test. It is considered that entry of the slurry component through the inner side of the recess occurred during repeated chemical mechanical polishing due to the absence of the surface layer forming the inner side of each recess, so that the polishing performance gradually deteriorated due to deformation of the recesses.

In the chemical mechanical polishing pad obtained in Comparative Example 3, the average opening ratio D1 was equal to the average opening ratio D2, and the surface layer forming the inner side of the recess was not provided. As a result, the removal rate achieved by the 200th polishing test was significantly lower than that achieved by the tenth polishing test and the number of scratches exceeded 20 in the 200th polishing test. It is considered that entry of the slurry component through the inner side of the recess occurred during repeated chemical mechanical polishing since the average opening ratio D1 was equal to the average opening ratio D2, and the surface layer forming the inner side of each recess was not provided, so that the polishing performance gradually deteriorated due to deformation of the recesses.

In the chemical mechanical polishing pad obtained in Comparative Example 4, the average opening ratio D1 of the inner side of the recess was 0%. Specifically, no opening was observed. When using the chemical mechanical polishing pad obtained in Comparative Example 4, an excellent removal rate was not obtained even in the first polishing test. It is considered that the above poor results were obtained because the slurry-retention capability during chemical mechanical polishing decreased due to the absence of an opening in the inner side of the recess and the surface of the polishing layer, so that the removal rate decreased.

It was thus confirmed that the chemical mechanical polishing pad which includes the surface layer that forms the inner side of the recess, and in which the ratio (D1/D2) of the average opening ratio D1 to the average opening ratio D2 is 0.01 to 0.5, can suppress entry of the slurry component through the inner side of the recess, so that the polishing performance is maintained even if chemical mechanical polishing is repeatedly performed.

The invention is not limited to the above embodiments. Various modifications and variations may be made of the above embodiments. For example, the invention includes various other configurations substantially the same as the configurations described in connection with the above embodiments (e.g., a configuration having the same function, method, and results, or a configuration having the same objective and results). The invention also includes a configuration in which an unsubstantial section (element) described in connection with the above embodiments is replaced with another section (element). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

REFERENCE SIGNS LIST

10: polishing layer, 10a, 10a': surface layer, 10b, 10b': deep layer, 12: support layer, 14: polishing system platen, 16, 17, 18, 19: recess, 20: polishing surface, 22, 24, 26, 28: cross section, 100, 200, 300: chemical mechanical polishing pad

The invention claimed is:

1. A chemical mechanical polishing pad, comprising:
a polishing layer; and
a recess in a polishing surface of the polishing layer, wherein
the polishing layer comprises a surface layer that forms at least an inner side of the recess,
a ratio (D1/D2) of an average opening ratio D1(%) to an average opening ratio D2(%) is from 0.01 to 0.5, in which the average opening ratio D1 is an average opening ratio of the inner side of the recess when the polishing layer has been immersed in water at 23° C. for 1 hour and the average opening ratio D2 is an average opening ratio of a cross section of the polishing layer that does not intersect the surface layer when the cross section has been immersed in water at 23° C. for 1 hour.

2. The chemical mechanical polishing pad of claim 1, wherein the average opening ratio D1 is from 0.1 to 20%.

3. The chemical mechanical polishing pad of claim 1, wherein the average opening ratio D2 is from 10 to 50%.

4. The chemical mechanical polishing pad of claim 1, wherein the inner side of the recess has a surface roughness (Ra) of from 1 to 10 micrometers.

5. The chemical mechanical polishing pad of claim 1, wherein
the polishing surface of the polishing layer has a silicon atom concentration of from 0.5 to 10 atom %.

6. The chemical mechanical polishing pad of claim 1, wherein
the inner side of the recess has a silicon atom concentration of from 0.5 to 10 atom %.

7. A chemical mechanical polishing method, comprising:
chemically and mechanically polishing a polishing target with the chemical mechanical polishing pad of claim 1.

8. The chemical mechanical polishing pad of claim 1, wherein the polishing surface of the polishing layer has a fluorine atom concentration of from 0.5 to 10 atom %.

9. The chemical mechanical polishing pad of claim 1, wherein the inner side of the recess has a fluorine atom concentration of from 0.5 to 10 atom %.

10. The chemical mechanical polishing pad of claim 1, wherein the ratio (D1/D2) of the average opening ratio D1(%) to the average opening ratio D2(%) is from 0.05 to 0.5.

11. The chemical mechanical polishing pad of claim 1, wherein the ratio (D1/D2) of the average opening ratio D1(%) to the average opening ratio D2(%) is from 0.1 to 0.4.

12. The chemical mechanical polishing pad of claim 2, wherein the average opening ratio D1 is from 1 to 15%.

13. The chemical mechanical polishing pad of claim 3, wherein the average opening ratio D2 is from 20 to 40%.

14. The chemical mechanical polishing pad of claim 3, wherein the average opening ratio D2 is from 12 to 40%.

15. The chemical mechanical polishing pad of claim 4, wherein the inner side of the recess has the surface roughness (Ra) of from 1.8 to 7.6 micrometers.

16. The chemical mechanical polishing pad of claim 5, wherein the polishing surface of the polishing layer has the silicon atom concentration of from 0.6 to 9.1 atom %.

17. The chemical mechanical polishing pad of claim 8, wherein
the polishing surface of the polishing layer has the fluorine atom concentration of from 0.8 to 8.3 atom %.

* * * * *